United States Patent [19]

Washitani et al.

[11] Patent Number: 5,076,207

[45] Date of Patent: Dec. 31, 1991

[54] APPARATUS FOR ATMOSPHERIC CHEMICAL VAPOR DEPOSITION

[75] Inventors: Akihiro Washitani; Masashi Ohmori; Kouichirou Tsutahara; Toru Yamaguchi, all of Itami, Japan

[73] Assignee: Mitsubishi Denki Kabushiki Kaisha, Japan

[21] Appl. No.: 376,877

[22] Filed: Jul. 7, 1989

[30] Foreign Application Priority Data

Apr. 13, 1989 [JP] Japan ................................. 1-91865

[51] Int. Cl.$^5$ ............................................ C23C 16/00
[52] U.S. Cl. ................................... 118/725; 118/715; 118/730; 427/50; 427/69; 437/225
[58] Field of Search ............... 118/719, 730, 725, 728, 118/729; 437/225; 427/69, 51, 70, 72; 29/25.01, 25.02

[56] References Cited

U.S. PATENT DOCUMENTS

| | | | |
|---|---|---|---|
| 4,676,195 | 6/1987 | Yasui et al. | 118/723 |
| 4,816,133 | 3/1989 | Barnett | 118/730 |
| 4,838,201 | 6/1989 | Fraas et al. | 118/725 |
| 4,840,139 | 6/1989 | Takei | 118/723 |
| 4,957,772 | 9/1990 | Saitoh et al. | 118/723 |

FOREIGN PATENT DOCUMENTS 63-157425   6/1988   Japan .

Primary Examiner—Olik Chaudhuri
Assistant Examiner—Long Pham
Attorney, Agent, or Firm—Leydig, Voit & Mayer

[57] ABSTRACT

An atmospheric CVD apparatus includes a gas head for ejecting reaction gases consisting of SiH$_4$ gas and O$_2$ gas, and a stage which is arranged at a position above the gas head and which is rotated while a semiconductor wafer retained on the bottom of the stage is heated to a temperature in the range of 380° C. to 440° C., the distance between the surface of the semiconductor wafer and the gas supply head being set in the range of 8 mm to 25 mm. The flow ratio between the reaction gases is so adjusted that when the flow rate of the O$_2$ gas is represented as 1.0, that of the SiH$_4$ gas is represented as 0.07 to 0.10. The apparatus deposits a reaction product film which excels in film thickness uniformity with a satisfactory level of reproducibility. Furthermore, the apparatus involves very little generation of foreign matter, including reaction products in the form of particles sticking to the surface of the semiconductor wafer, thereby making it possible to produce high-quality semiconductor devices.

4 Claims, 6 Drawing Sheets

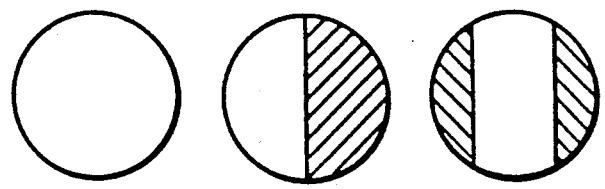
FIG. 11(a) FIG. 11(b) FIG. 11(c)
FIG. 11(d)
FIG. 11(e)
FIG. 12
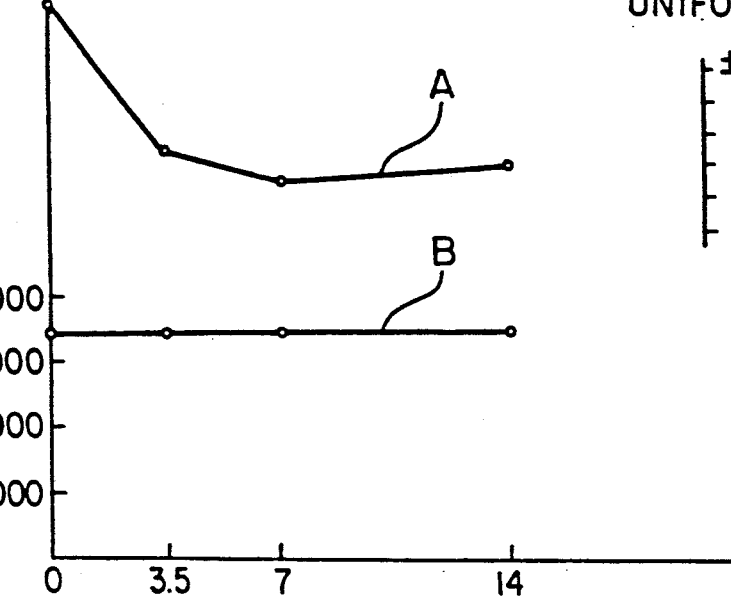

APPARATUS FOR ATMOSPHERIC CHEMICAL VAPOR DEPOSITION

BACKGROUND OF THE INVENTION

1. Field of the Invention

This invention relates to an apparatus and method for atmospheric CVD (chemical vapor deposition) and, in particular, to and method for atmospheric CVD suitable for forming a thin film on an object e.g., a semiconductor wafer.

2. Description of the Related Art

FIG. 1 is a sectional view of the essential part of a conventional atmospheric CVD apparatus. The apparatus shown is equipped with a stage 3 for holding a heated semiconductor wafer 2 and a gas supply head 1 arranged over the stage 3. The semiconductor wafer 2 is heated by a resistance heater 4 incorporated in the stage 3. The gas supply head 1 is separated from the stage. 3 by a predetermined distance (e.g., 5 mm or less) and is equipped with a multitude of holes 7 and 8 through which a plurality of reaction gas components, such as $SiH_4$ gas 5 and $O_2$ gas 6 are respectively supplied. The $SiH_4$ gas 5 and the $O_2$ gas 6 are blown through these holes 7 and 8 to form a reaction product film 9 on the semiconductor wafer. Those portions of the $SiH_4$ gas 5 and the $O_2$ gas 6 which have not contributed to the formation of the reaction product film 9 as well as the reaction product gas generated through reaction in the gas phase by the reaction gases are discharged out of the atmospheric CVD apparatus by an exhaust flow 12 through an exhaust outlet 11 provided in an exhaust chamber 10.

With the above-described conventional atmospheric CVD apparatus, the semiconductor wafer 2 is arranged below the gas supply head 1, the reaction product film 9 being formed by supplying the $SiH_4$ gas 5 and the $O_2$ gas 6 blown out through the holes 7 and 8 to the surface of the semiconductor wafer 2 previously heated on the stage 3.

The growing speed of the reaction product film 9 in this type of atmospheric CVD apparatus is dependent on the concentration of the reaction gases supplied from the gas supply head 1 and the temperature of the semiconductor wafer 2, i.e., the temperature of the stage 3. Consequently, in order to ensure that the film thickness of the reaction product film 9 is uniform, the concentration of the reaction gases must be kept constant at all positions above the semiconductor wafer 2, and the temperature of the stage 3 must be controlled to ensure that it is kept at the level most suitable for the reaction.

With the above-described atmospheric CVD apparatus, setting the distance between the stage 3 and the gas supply head 1 at a value less than 5 mm, as shown in FIG. 1, will result in the $SiH_4$ gas 5 and the $O_2$ gas 6 impinging on the semiconductor wafer 2 before they are satisfactorily mixed together in the gas phase, and then being mixed together in a turbulent condition. As a result, the reaction gases supplied to the surface of the semiconductor wafer 2 is not mixed in an even concentration, so that a reaction product film 9 with a uniform film thickness cannot be obtained. In addition, the temperature of the reaction gases on the surface of the semiconductor wafer 2 is relatively low, so that no chemical reaction takes place on the surface of the semiconductor wafer 2, most of the gases undergoing reaction in the gas phase, which leads to the generation of foreign matter, i.e., unnecessary by-products.

When the distance between the stage 3 and the gas supply head 1 is set to a value as high as about 6 mm or more, as shown in FIG. 2, the reaction gas flow velocity must be greater than the velocity of the exhaust flow 12 (pumping speed) and the velocity of the gas flow generated by the temperature rise due to the heating of the stage 3. If the reaction gas flow velocity is low, the reaction gas components flow in the directions indicated by arrows 5 and 6, resulting in poor reaction efficiency on the semiconductor wafer 2. If, on the other hand, the reaction gas flow velocity is high enough for the reaction gas components, i.e., the $SiH_4$ gas 5 and the $O_2$ gas 6, to reach the semiconductor wafer 2 (as indicated by arrows 5' and 6' of FIG. 2), the concentration of the $SiH_4$ gas 5 in those areas of the surface of the semiconductor wafer 2 which face the holes 7 becomes higher than in the other areas, and the concentration of the $O_2$ gas in those areas of the surface of the semiconductor wafer 2 which face the holes 8 becomes higher than in the other areas, resulting in an uneven reaction gas concentration. Furthermore, since the reaction gas flow velocity is relatively high, the heat of the surface of the semiconductor wafer 2 is apt to be carried away by the reaction gases, so that the temperature of the surface of the semiconductor wafer 2 becomes unstable, a condition which precludes formation of a reaction product film 9 with a uniform film thickness.

SUMMARY OF THE INVENTION

This invention has been contrived with a view to eliminating the above problems experienced with conventional atmospheric CVD apparatus. It is accordingly an object of this invention to provide an atmospheric CVD apparatus which is capable of efficiently supplying reaction gas components that contribute to the formation of a reaction product film 9 on the surface of a semiconductor wafer 2, thereby making it possible to obtain a reaction product film 9 having a uniform film thickness.

In accordance with one aspect of this invention, there is provided an atmospheric CVD apparatus comprising: a stage arranged at an upper position in the atmospheric CVD apparatus, for retaining a semiconductor wafer on the surface of which a reaction product film is formed by means of reaction gases, and equipped with means for heating the semiconductor wafer; means for rotating the stage; a gas supply head arranged below the stage, concentric and face to face therewith, and having a multitude of holes for supplying $SiH_4$ gas and $O_2$ gas to the surface of the semiconductor wafer; and an exhaust chamber for discharging reaction gases and reaction products in the gas phase.

In accordance with another aspect of this invention, there is provided an atmospheric CVD method comprising the steps of: rotating a stage arranged at an upper position in an atmospheric CVD apparatus; supplying $SiH_4$ gas and $O_2$ gas which constitute the reaction gases to the semiconductor wafer from a gas supply head which is arranged face to face and concentric with the stage and which has a multitude of holes so that a reaction product film may be formed on the surface of the semiconductor wafer by means of the reaction gases; the distance between the surface of the semiconductor wafer and the gas supply head being set to a value in the range of 8 mm to 25 mm, the semiconductor wafer being heated at a temperature in the range of 380° C. to 440° C., and the flow rate ratio between the reaction gases blown from the gas supply head being so adjusted that when the flow rate of the $O_2$ gas is represented as 1.0, that of the $SiH_4$ gas is represented as 0.07 to 0.10.

In accordance with this invention, a reaction product layer having a thickness in the range of 0.1 to 0.5 mm is formed with a satisfactory degree of reproducibility at a position which is directly below the semiconductor wafer and which is separated therefrom by 0.2 to 1 mm, the reaction gas being dispersed through this reaction product layer over the surface of the semiconductor wafer, thereby making it possible to form on the surface of the semiconductor wafer a reaction product layer which excels in film thickness uniformity.

BRIEF DESCRIPTION OF THE DRAWINGS

FIG. 11(a)–FIG. 11(c) illustrate three different conditions of opening of a gas supply head, FIG. 11(d) is a graph of the uniformity of film thickness for the three gas supply head opening conditions, and FIG. 11(e) is a graph of the speed of film formation for the three gas supply head opening conditions and FIG. 12 is a chart showing the in-surface uniformity and the film forming speed of the reaction product film when the stage is rotated.

DETAILED DESCRIPTION OF THE PREFERRED EMBODIMENTS

Figure 1:
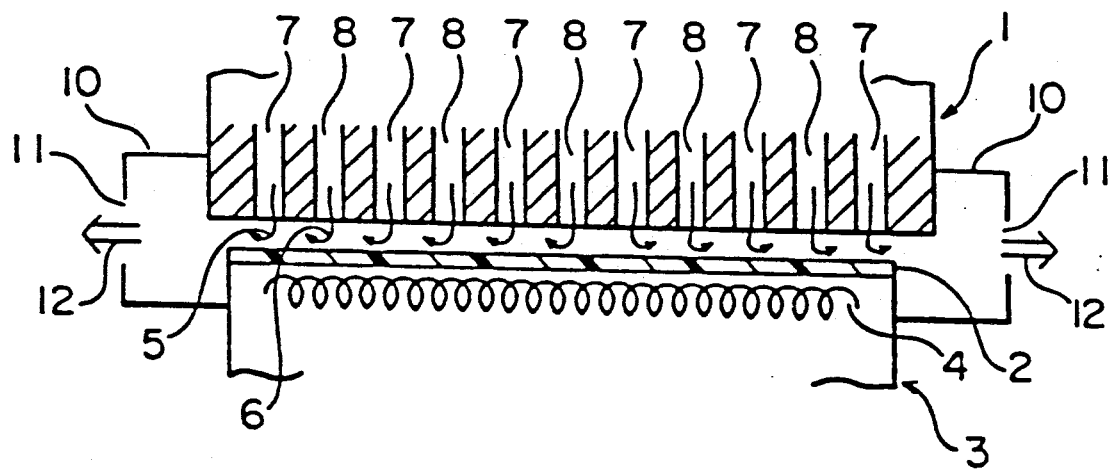
FIGS. 1 and 2 are sectional views showing the essential part of a conventional atmospheric CVD apparatus.
Figure 2:
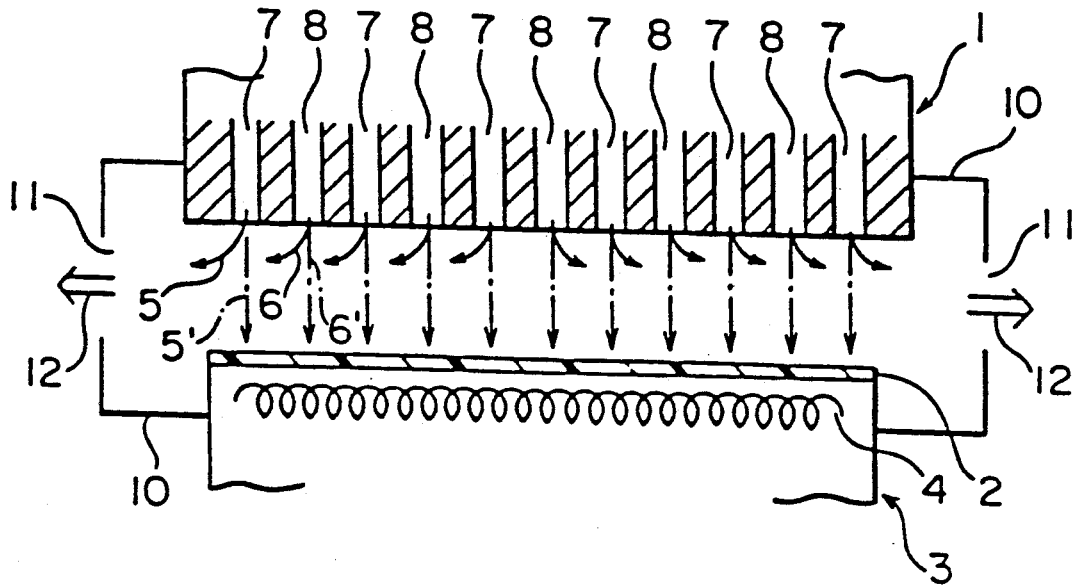
Figure 3:
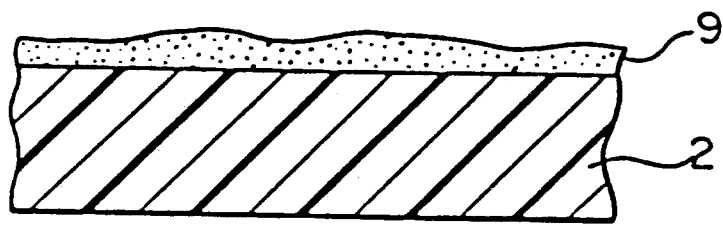
FIG. 3 is an enlarged sectional view of a semiconductor wafer on the surface of which is formed a reaction product film.
Figure 4:
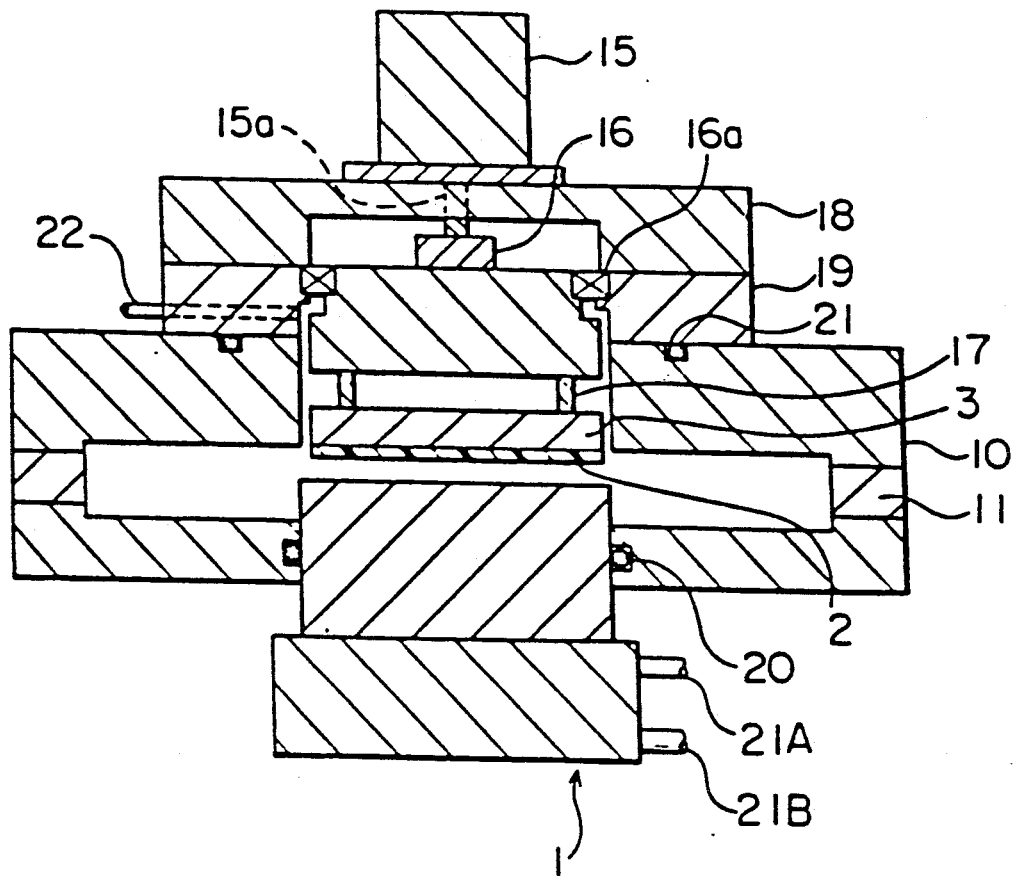
FIG. 4 is a schematic sectional view showing an atmospheric CVD apparatus in accordance with an embodiment of this invention.
Figure 5:
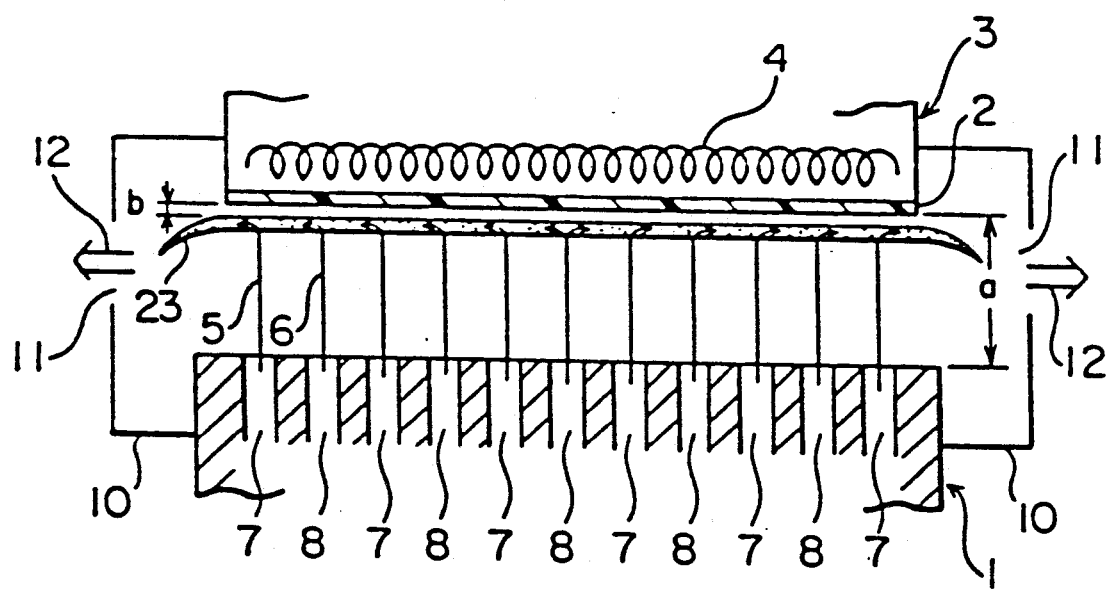
FIG. 5 is a sectional view showing part of the apparatus shown in FIG. 4.

FIG. 4 is a schematic sectional view of an atmospheric CVD apparatus in accordance with an embodiment of this invention, and FIG. 5 a sectional view showing part of the device shown in FIG. 4. The device shown includes a gas supply head 1 and a stage 3 arranged over the gas supply head 1, a semiconductor wafer 2 being retained on the bottom surface of the stage 3 by means of a vacuum or an electrostatic chuck (not shown). Incorporated in the inside of the stage 3 is a heating means, such as a resistance heater 4, by means of which the semiconductor wafer 2 is heated. The diameter of the gas supply head 1 is several millimeters larger than that of the stage 3. The device further includes an exhaust chamber 10 which has the function of discharging the reaction gases and reaction products in the gas phase from the device through an exhaust outlet 11 as well as the function of guiding the vertically slidable gas supply head 1. Provided between the exhaust chamber 10 and the gas supply head 1 and between the exhaust chamber 10 and a plate-like member 19 (described below) are O-rings 20 and 21, respectively, which serve as airtight seals to prevent the reaction gases, etc., from escaping through sections other than the exhaust outlet 11. The reaction gases which consist of $SiH_4$ gas 5 and $O_2$ gas 6 are respectively mixed with a carrier gas and are supplied to the inside of the gas supply head 1 through reaction gas supply ports 21A and 21B. They are not mixed with each other within the gas supply head 1. Instead, they are separately blown through $SiH_4$ gas holes 7 and $O_2$ gas holes 8 toward the surface of the semiconductor wafer 2. The stage 3 which retains a semiconductor wafer 2 is connected through heat insulating rods 17 to a turning axis member 16 and fixed thereto with a gap of about 20 mm between wafer 2 and member 16. This turning axis member 16 is connected to the axle 15a of a turning motor 15. The stage 3 can be rotated by the turning axis body 16 through a bearing 16a. The turning motor 15 is fixed to plate-like members 18 and 19 by means of clamp screws (not shown), the members 18 and 19 being fixed to the exhaust chamber 10 by means of clamp screws (not shown). The member 18 is mounted on a vertically movable reciprocating cylinder (not shown), and is operated in the vertical direction when attaching or detaching the semiconductor wafer 2 to or from the stage 3. Provided in the side section of the member 19 is a supply port 22 for an inactive gas, such as $N_2$ and Ar. The inactive gas is supplied through this supply port 22 under a pressure slightly higher than that of the reaction gas, thereby preventing the reaction gas and the reaction products from flowing into the gap between the stage 3 and the exhaust chamber 10.

The heated stage 3 is situated above the gas supply head 1. As a result of this arrangement, the temperature around the stage 3 is considerably higher than that around the gas supply head 1. The ascending current due to this difference in temperature causes the $SiH_4$ gas 5 and the $O_2$ gas 6 blown out from the gas supply head 1 to flow substantially upwards and be mixed together to a satisfactory degree in the vicinity of the semiconductor wafer 2 The wafer 2 has been heated as a result of the rise in temperature to cause a gas phase reaction. As a result of this gas phase reaction, a reaction product layer 23 which looks like white smoke is formed at a position directly below the semiconductor wafer 2 and separated therefrom by a distance in the range of 0.2 to 1 mm (shown by the reference character b in FIG. 5). This reaction product layer 23 has a thickness in the range of 0.1 mm to 0.5 mm, and consists of intermediate reaction products, such as SiO, $SiO_2$, $O_2$ and Si, gathered together. Because of the presence of this reaction product layer 23, the $SiH_4$ gas 5 and the $O_2$ gas 6 supplied from the gas supply head 1 do not directly reach the surface of the semiconductor wafer 2 but are mixed together in this reaction product layer 23 to cause a gas phase reaction. Then, the intermediate reaction products, such as SiO, $SiO_2$, $O_2$ and Si, are dispersed over the surface of the semiconductor wafer 2, thereby allowing a uniform reaction product film 9 to be obtained.

Figure 6:
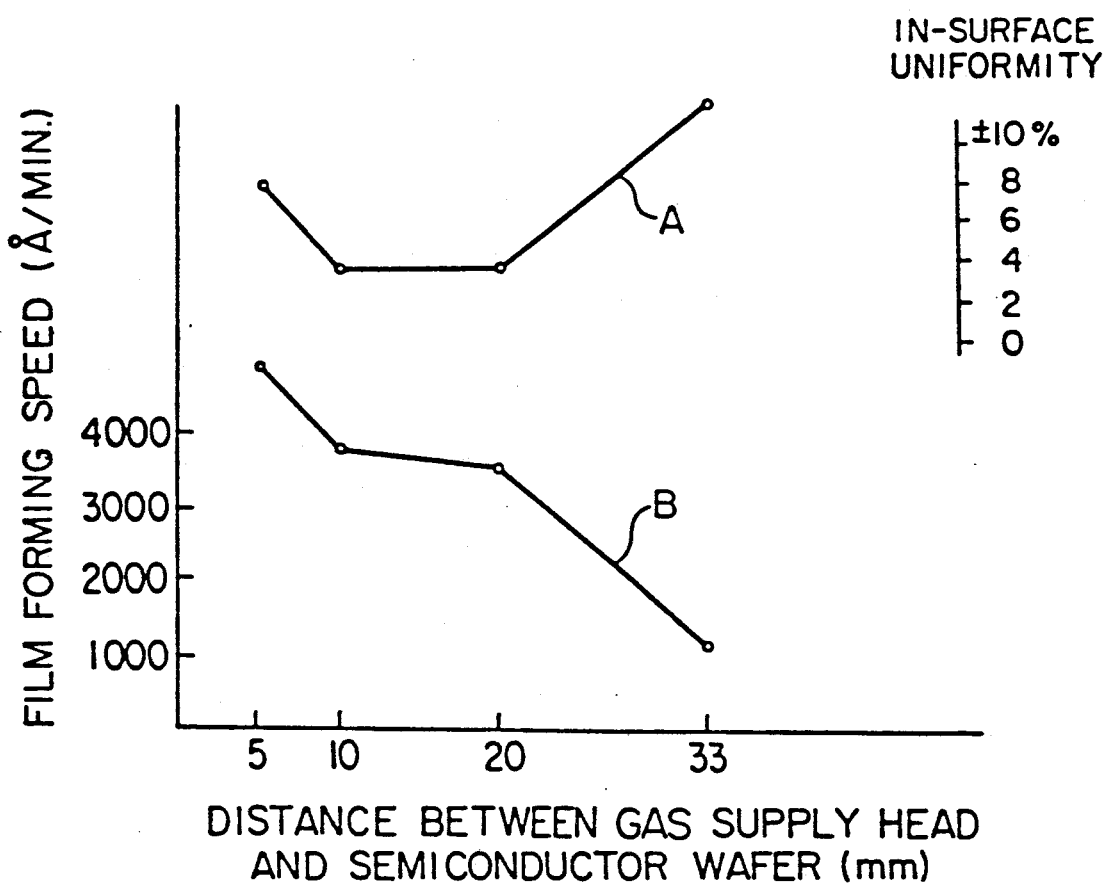
FIG. 6 is a chart showing the in-surface uniformity and the film forming speed of the reaction product film when the distance between the gas supply head and the semiconductor wafer is varied.

In the atmospheric CVD device having the above-described construction, it is desirable that the distance (indicated by the reference character a in FIG. 5) between the gas supply head 1 and the surface of the semiconductor wafer 2 be in the range of 8 mm to 25 mm. FIG. 6 shows the in-surface uniformity and the film forming speed of the reaction product film 9 when the distance between the gas supply head 1 and the semiconductor wafer 2 is varied. In the chart, the curve A represents the in-surface uniformity of the reaction product film 9, i.e., the proportion of the thickness of the uneven sections to the entire thickness of the reaction product film 9, and the curve B represents the film forming speed (Å/min) of the reaction product film 9. As is apparent from this chart, when the distance between the gas supply head 1 and the semiconductor wafer 2 is in the range of 8 mm to 25 mm, a satisfactory film forming speed and a high degree of insurface uniformity can be attained. However, if the distance is beyond this range, an excessive degree of in-surface uniformity will result in the reaction product film 9, which is not desirable. The most satisfactory results are obtained when the above-mentioned distance is in the range of 10 mm to 15 mm.

Figure 7:
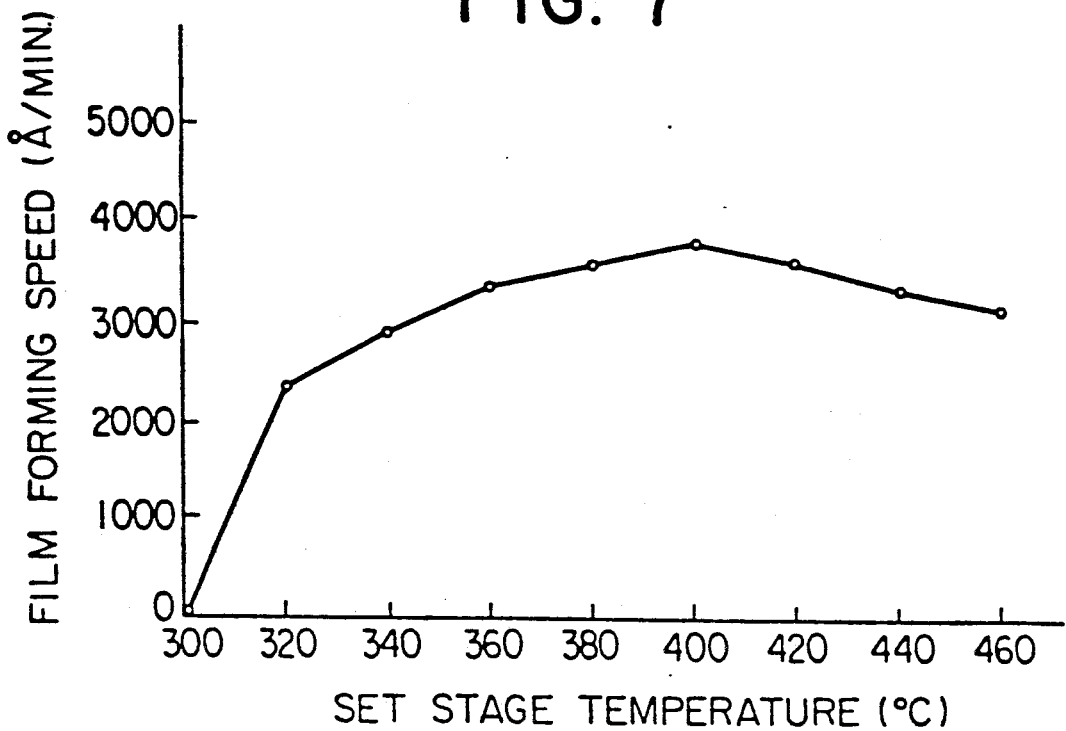
FIGS. 7 and 8 are charts showing the film forming speed and the film thickness uniformity, respectively, of the reaction product film when the set temperature of the stage is varied.
Figure 8:
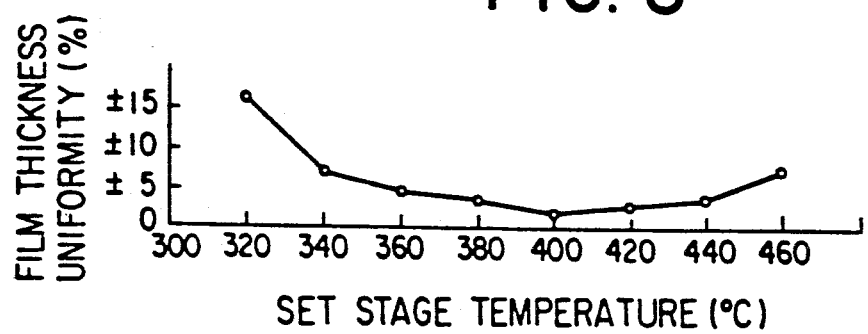

The surface of the semiconductor wafer 2 is preferably heated at a temperature in the range of 380° C. to 440° C. FIGS. 7 and 8 show the film forming speed and the film thickness uniformity, respectively, of the reaction product film 9 when the set temperature of the stage 3 is varied. As is apparent from these charts, when the surface temperature of the semiconductor wafer 2 is in the range of 380° C. to 440° C., the film forming speed of the reaction product film 9 is in the range of 3200Å to 3700Å per minute, and the film thickness uniformity is in the range of 5% to 2%. Thus, this temperature range provides a satisfactory result. While the set temperature of the stage 3 was varied in the measurements, the temperatures of the stage 3 and the semiconductor wafer 2 are substantially equal to each other. The flow rates of the specimen gases used in the measurements recorded in FIGS. 7 and 8 were 50 cc/min for $SiO_2$ and 500 cc/min for $O_2$.

Figure 9:
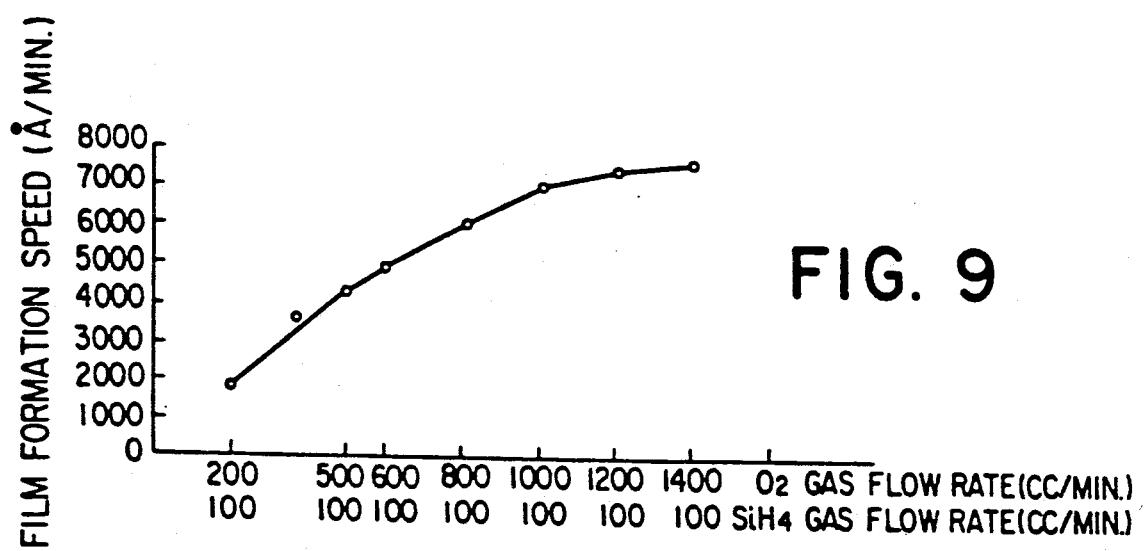
FIGS. 9 and 10 are charts showing the film forming speed and the film thickness uniformity, respectively, of the reaction product film when the flow rate of the $O_2$ gas is varied, keeping the flow rate of the $SiH_4$ gas constant.
Figure 10:
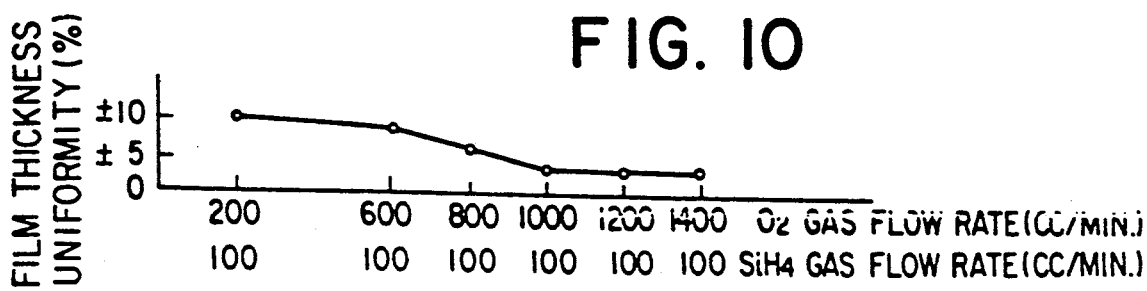

The ratio between the flow rate of the $SiH_4$ gas 5 and that of the $O_2$ gas 6 blown from the gas supply head 1 is preferably such that when the $O_2$ gas flow rate is represented as 1.0, the $SiH_4$ gas flow rate is in the range of 0.07 to 0.10. FIGS. 9 and 10 show the film forming speed and the film thickness uniformity, respectively, of the reaction product film 9 when the flow rate of the $O_2$ gas is varied while keeping the flow rate of the $SiH_4$ gas constant. As is apparent from these charts, when the flow rate ratio of the reaction gases is such that the $SiH_4$ gas flow rate is in the range of 0.07 to 0.10 when the $O_2$ gas flow rate is represented as 1.0, a satisfactory film forming speed can be attained as well as an excellent film thickness. The measurements recorded in FIGS. 9 and 10 were conducted with the temperature Of the stage 3 set at 400° C., with the distance between the gas supply head 1 and the stage 3 being 10 mm. The flow rates of the carrier gases of the $SiH_4$ gas and the $O_2$ gas were set at 12.5 lit./min. and 1 lit./min., respectively, so that the flow rates shown in the charts could be attained.

It is desirable that the gas supply head 1 and the stage 3 be arranged concentrically. As shown in FIG. 11(a), all of the gas supply head 1 was opened and in FIGS. 11(b) and 11(c), one half, for example, of the gas supply head 1 was closed, as indicated by the shaded portion, the reaction gas being allowed to blow out only from the other half. The film thickness uniformity of the reaction product film 9 formed in this condition was about 16%. The film thickness uniformity when a quarter portion on either side of the gas supply head 1 was closed (FIG. 11(c)) was about 8%. In contrast, the film thickness uniformity when the reaction gas was allowed to be blown from the entire surface of the gas supply head 1 (FIG. 11a) was about 3%. The film forming speed of the reaction product film 9, however, was about 3300Å/min. in all three cases. It will be appreciated from these results that the gas supply head 1 and the stage 3 should be arranged concentrically, not eccentrically.

Furthermore, it is desirable that the stage 3 be rotated while forming a reaction product film. FIG. 12 shows the insurface uniformity (indicated by the curve A in the chart) and the film forming speed (indicated by the curve B in the chart) when the stage 3 is turned at a predetermined rotating speed. As will be appreciated from this chart, the in-surface uniformity when the stage 3 is turned exhibits a relatively low value, whereas the in-surface uniformity when the stage 3 is not turned (turning speed: 0 deg./sec.) is relatively high. Thus, the turning of the stage 3 helps to attain a satisfactory result.

When the above-mentioned conditions are complete, a reaction product layer 23 having a thickness of 0.1 mm to 0.5 mm is formed with a satisfactory level of reproducibility at a position which is directly below the semiconductor wafer 2 and which is separated therefrom by a distance of 0.2mm to 1 mm. This allows a reaction product film 9 excellent in film thickness uniformity to be formed on the surface of the semiconductor wafer 2 with a satisfactory level of reproducibility. In addition, this involves very little generation of foreign matter, including reaction products in the form of particles sticking to the surface of the semiconductor wafer, thereby making it possible to produce high-quality semiconductor devices.

What is claimed is:

1. An atmospheric CVD apparatus comprising:
   a stage disposed in said atmospheric CVD apparatus for retaining a semiconductor wafer having a downwardly oriented surface;
   means for heating said semiconductor wafer;
   means for concentrically rotating said stage and said semiconductor wafer relative to a gas supply head;
   a gas supply head disposed below, concentric with, and facing said stage including a plurality of holes for supplying reaction gases toward the surface of said semiconductor wafer; and
   an exhaust chamber for discharging reaction gases and reaction products in the gas phase.

2. An apparatus as claimed in claim 1 wherein the distance between the surface of the semiconductor wafer and said gas supply head is in the range of 8 mm to 25 mm.

3. An apparatus as claimed in claim 1 wherein the distance between the surface of the semiconductor wafer and said gas supply head apparatus in the range of 10 mm to 15 mm.

4. An apparatus as claimed in claim 1 wherein the semiconductor wafer is heated to a temperature in the range of 380° C. to 440° C., the reaction gases are $O_2$ and $SiH_4$, and wherein the flow ratio between the reaction gases supplied from said gas supply head is so adjusted that the flow rate of the $SiH_4$ gas is 7 to 10 percent of the flow rate of the $O_2$ gas.

* * * * *

UNITED STATES PATENT AND TRADEMARK OFFICE
CERTIFICATE OF CORRECTION

PATENT NO. : 5,076,207
DATED : December 31, 1991
INVENTOR(S) : Washitani et al.

It is certified that error appears in the above-identified patent and that said Letters Patent is hereby corrected as shown below:

Claim 3, column 6, line 58, change "apparatus" to --is--.

Signed and Sealed this

Eleventh Day of May, 1993

Attest:

MICHAEL K. KIRK

*Attesting Officer*  *Acting Commissioner of Patents and Trademarks*